United States Patent
Hong et al.

(10) Patent No.: US 10,497,719 B2
(45) Date of Patent: Dec. 3, 2019

(54) METHOD FOR SELECTIVELY INCREASING SILICON FIN AREA FOR VERTICAL FIELD EFFECT TRANSISTORS

(71) Applicant: Samsung Electronics Co., Ltd., Gyeonggi-do (KR)

(72) Inventors: Joon Goo Hong, Austin, TX (US); Kang Ill Seo, Fairfax, VA (US); Borna J. Obradovic, Leander, TX (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/880,156

(22) Filed: Jan. 25, 2018

(65) Prior Publication Data

US 2019/0148410 A1    May 16, 2019

Related U.S. Application Data

(60) Provisional application No. 62/587,333, filed on Nov. 16, 2017.

(51) Int. Cl.
| | |
|---|---|
| *H01L 27/12* | (2006.01) |
| *H01L 21/027* | (2006.01) |
| *H01L 21/02* | (2006.01) |
| *H01L 21/477* | (2006.01) |
| *H01L 27/088* | (2006.01) |
| *H01L 29/423* | (2006.01) |
| *H01L 29/66* | (2006.01) |
| *H01L 29/786* | (2006.01) |

(52) U.S. Cl.
CPC ...... *H01L 27/1211* (2013.01); *H01L 21/0201* (2013.01); *H01L 21/027* (2013.01); *H01L 21/477* (2013.01); *H01L 27/0886* (2013.01); *H01L 27/1288* (2013.01); *H01L 29/42392* (2013.01); *H01L 29/66772* (2013.01); *H01L 29/78618* (2013.01); *H01L 29/78642* (2013.01); *H01L 29/78654* (2013.01)

(58) Field of Classification Search
CPC ......... H01L 27/1211; H01L 1121/0201; H01L 27/027; H01L 27/477
USPC .......................................................... 257/401
See application file for complete search history.

(56) References Cited

U.S. PATENT DOCUMENTS

| | | |
|---|---|---|
| 6,885,055 B2 | 4/2005 | Lee |
| 7,419,857 B2 | 9/2008 | Choi et al. |
| 7,452,778 B2 | 11/2008 | Chen et al. |
| 8,101,473 B2 | 1/2012 | Cho et al. |
| 8,159,018 B2 | 4/2012 | Akil et al. |
| 8,426,277 B2 | 4/2013 | Lin et al. |
| 8,987,092 B2 | 3/2015 | Kang et al. |
| 9,117,906 B2 | 8/2015 | Fumitake et al. |
| 9,716,086 B1 | 7/2017 | Cheng et al. |

(Continued)

*Primary Examiner* — Tong-Ho Kim

(74) *Attorney, Agent, or Firm* — Van Pelt, Yi & James LLP

(57) ABSTRACT

A method for providing a semiconductor device is described. The method provides a plurality of fins. A first portion of each of the plurality of fins is covered by a mask. A second portion of each of the plurality of fins is exposed by the mask. The method also performs an anneal in a volume-increasing ambient, such as hydrogen, at anneal temperature(s) above one hundred degrees Celsius and not more than six hundred degrees Celsius. The second portion of each of the fins is exposed during the anneal such that the second portion of each of the fins undergoes a volume expansion.

10 Claims, 7 Drawing Sheets

(56) References Cited

U.S. PATENT DOCUMENTS

| | | | |
|---|---|---|---|
| 9,997,413 B1* | 6/2018 | Leobandung | ... H01L 21/823487 |
| 2010/0048027 A1* | 2/2010 | Cheng | ............... H01L 21/30608 |
| | | | 438/745 |
| 2011/0006348 A1* | 1/2011 | Cho | ....................... B82Y 10/00 |
| | | | 257/252 |
| 2011/0018065 A1 | 1/2011 | Curatola | |

* cited by examiner

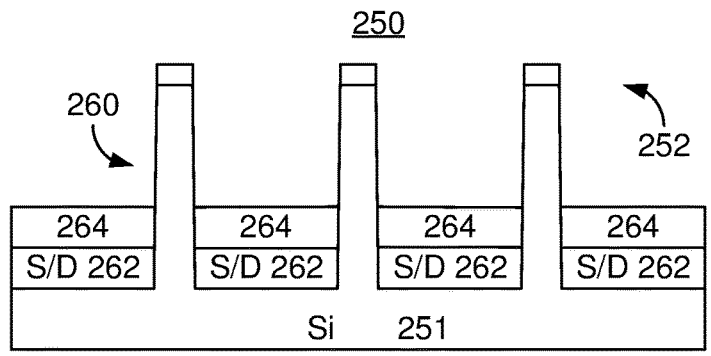 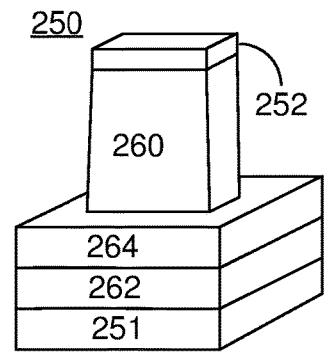
FIG. 5A  FIG. 5B
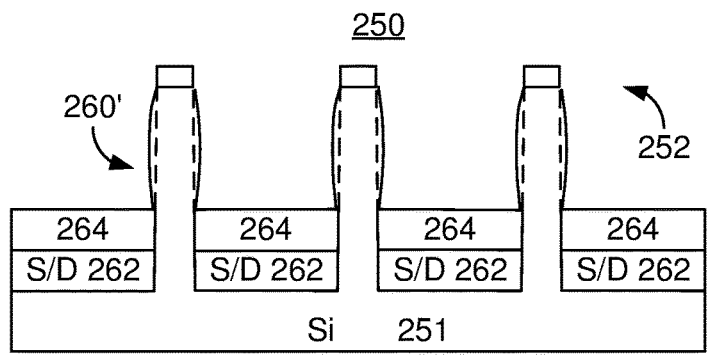 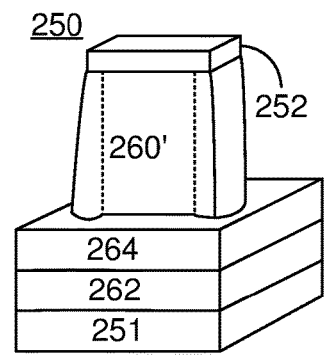
FIG. 6A  FIG. 6B
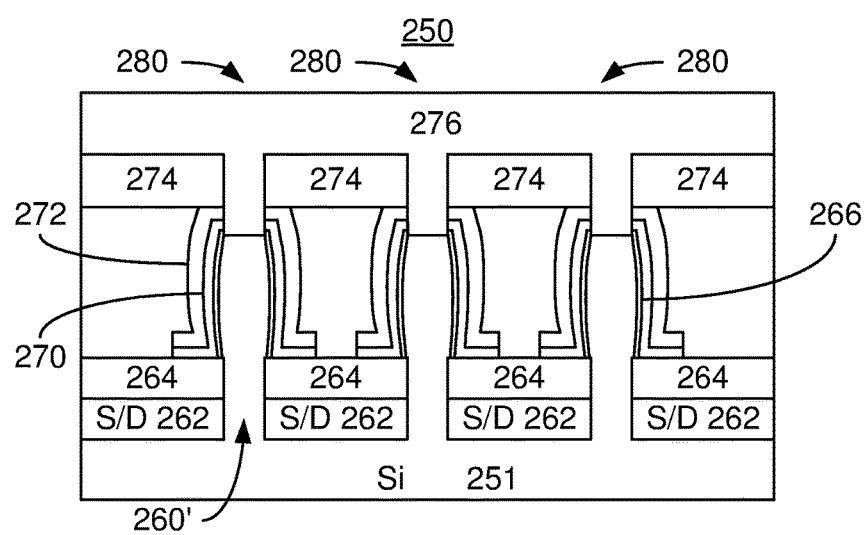
FIG. 7

METHOD FOR SELECTIVELY INCREASING SILICON FIN AREA FOR VERTICAL FIELD EFFECT TRANSISTORS

CROSS-REFERENCE TO RELATED APPLICATIONS

This application claims the benefit of provisional Patent Application Ser. No. 62/587,333, filed Nov. 16, 2017, entitled "METHOD TO SELECTIVELY INCREASE SILICON FIN AREA FOR A VERTICAL FIELD EFFECT TRANSISTOR", assigned to the assignee of the present application, and incorporated herein by reference.

BACKGROUND

The trend in CMOS devices is toward decreased size. However, scaling down in size generally degrades device performance. In order to address issues in planar CMOS devices, vertical devices have been developed. Vertical architectures can increase device density and improve performance. For example, fin field effect transistors (finFETs) have been developed. FinFETs may have better electrostatic or short channel effect (SCE) control than planar CMOS devices. Density and effective emitter width ($W_{eff}$) efficiency are independent of gate length ($L_g$), which allows more relaxed $L_g$ for vertical devices. FinFET devices are thus replacing planar CMOS devices at smaller scales.

Performance of vertical devices is still desired to be improved. Mechanisms for improving performance other than varying $L_g$ are limited because of tight density within a specific layout for such devices. Thus, research in vertical device architectures is ongoing.

BRIEF SUMMARY OF THE INVENTION

A method for providing a semiconductor device is described. The method provides a plurality of fins. A first portion of each of the plurality of fins is covered by a mask. A second portion of each of the plurality of fins is exposed by the mask. The method also performs an anneal in a volume-increasing ambient, such as hydrogen. The anneal is at anneal temperature(s) above one hundred degrees Celsius and not more than six hundred degrees Celsius. The second portion of each of the fins is exposed during the anneal such that the second portion of each of the fins undergoes a volume expansion.

The method processes the fin so that the fin bulges where the fin is exposed to hydrogen anneal. Stated differently, the exposed portion undergoes a volume expansion. If the channel area is exposed and annealed, the effective channel width is increased by bulge/volume expansion. If the top of the fin is exposed, the bulge/volume increase may provide a larger volume for top source/drain processing. This may decrease the parasitic resistance at the top source/drain side.

BRIEF DESCRIPTION OF SEVERAL VIEWS OF THE DRAWINGS

FIGS. 5A-7 depict portions of an exemplary embodiment of a semiconductor device including finFETs during fabrication.

DETAILED DESCRIPTION OF THE INVENTION

Figure 1:
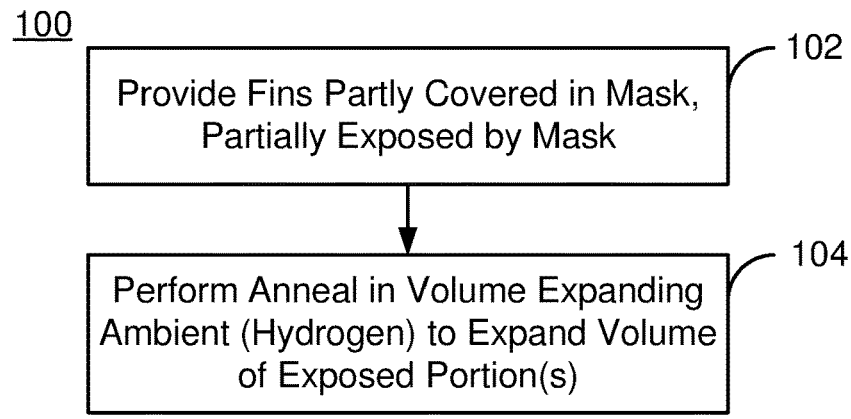
FIG. 1 is a flow chart depicting an exemplary embodiment of a method for selectively increasing the volume of a portion of a fin structure in a semiconductor device.

The exemplary embodiments relate to formation of finFETs. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations.

Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or fewer components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

A method for providing a semiconductor device is described. The method provides a plurality of fins. A first portion of each of the plurality of fins is covered by a mask. A second portion of each of the plurality of fins is exposed by the mask. The method also performs an anneal in a volume increasing ambient, such as hydrogen. The anneal is performed at anneal temperature(s) above one hundred degrees Celsius and not more than six hundred degrees Celsius. The second portion of each of the fins is exposed during the anneal such that the second portion of each of the fins undergoes a volume expansion.

FIG. 1 is a flow chart depicting an exemplary embodiment of a method 100 for providing a fin structures having selectively expanded volumes for components, i.e. fin field effect transistors (finFETs), in a semiconductor device. For simplicity, some steps may be omitted, performed in another order and/or combined. Some steps may also include substeps. Further, the method 100 may start after other steps in forming the semiconductor device have been performed. For example, the method may start after the semiconductor for the fins has been provided. FIGS. 2A-2B and 3A-3B depict portions of exemplary embodiments of semiconductor devices 200 and 200A, respectively, during fabrication of the fin structures using the method 100. For simplicity, not all components are shown in FIGS. 2A-3B and FIGS. 2A-3B are not to scale. Further, the thicknesses or shapes of particular layer(s) may be exaggerated for explanatory purposes. The method 100 is described in the context of the semiconductor devices 200 and 200A. However, nothing prevents the method 100 from being used with a different semiconductor device.

The fins for the semiconductor device are fabricated and prepared for a volume-enhancing anneal, via step 102. Formation of the fins in step 102 includes providing a thin hard mask on a semiconductor layer such as Si. The hard mask covers the portions of the Si layer which are to form the fins and exposes the portions of the Si layer to be removed. An etch may then be performed to define the fins from the Si layer. In addition, step 102 ensures that the desired portion of the fins are exposed for the volume-enhancing anneal. Thus, an annealing mask that exposes the portions of the fins that are to have their volume increased is also provided. The annealing mask covers the portions of the fins that are not desired to undergo the volume expansion. In some embodiments, the annealing mask includes part of the hard mask used in forming the fins. In such embodiments, the tops of the fins are desired to be protected from the volume-increasing anneal. In other embodiments, the hard mask is removed and is not part of the annealing mask. In some such embodiments, the tops of the fins are desired to have increased volume. Other structures, such as spacer layers or other mask layers, may form all or part of annealing the mask.

Figure 2A:
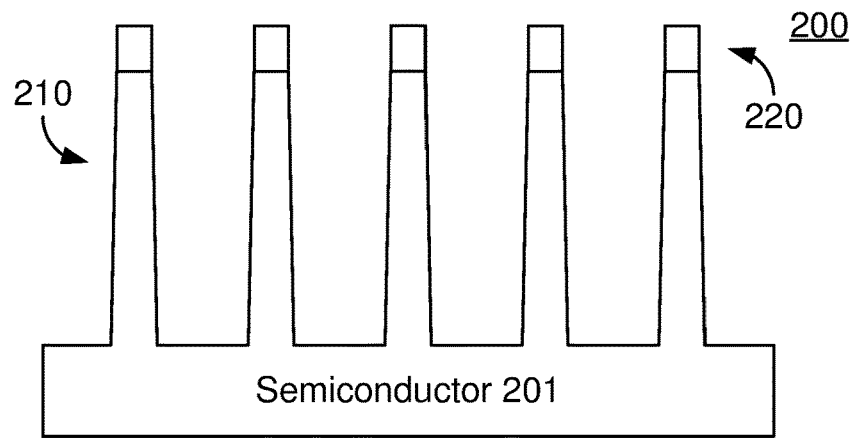
FIGS. 2A-2B depict portions of an exemplary embodiment of fin structures during fabrication.
Figure 3A:
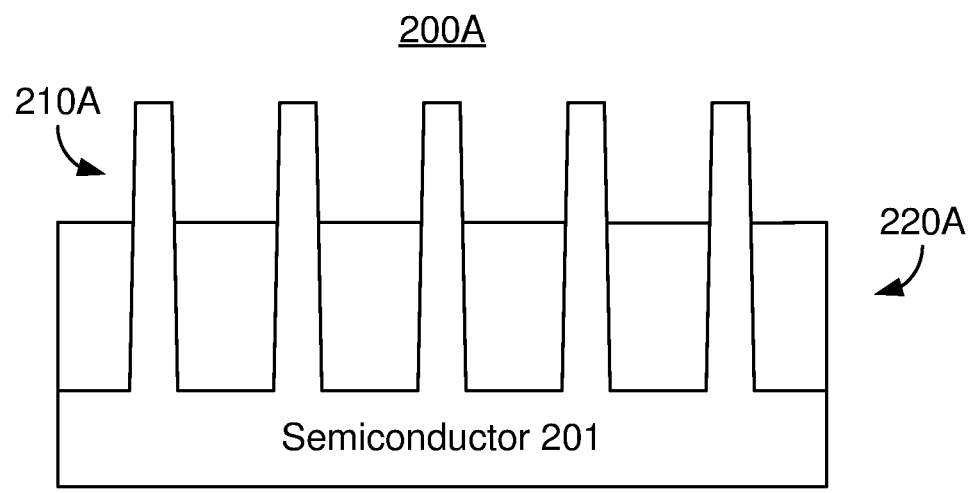
FIGS. 3A-3B depict portions of another exemplary embodiment of fin structures during fabrication.

FIGS. 2A and 3A depict semiconductor devices 200 and 200A, respectively, after step 102. Referring to FIG. 2A, the fins 210 have been formed from the semiconductor layer 201. As discussed above, the semiconductor layer 201 may be Si. The semiconductor device 200 is desired to have its channel experience an increase in volume. Consequently, the sidewalls of the fins are desired to bow outward, providing a convex cross section for each of the fins 210. However, the top surface of each fin is desired to remain substantially unchanged. Consequently, the mask 220 exposes the sidewalls of the fins 210. In some embodiments, the mask 220 is used in defining the fins 210 from the underlying semiconductor layer 201. Similarly, FIG. 3A depicts fins 210A that have been formed from the semiconductor layer 201. However, the semiconductor device 200A is desired to have the fin volume increase near the top source and/or drain (source/drain). The channel width is desired to remain substantially unchanged. Thus, mask 220A covers much of the sidewalls of the fins 210A, but exposes the tops of the fins 210A.

While the masks 220 and 220A are present, the semiconductor devices 200 and 200A are annealed in a volume-increasing ambient, via step 104. The volume-increasing ambient is hydrogen for the Si fins 210 and 210A. This anneal is carried out such that the desired portions of the fins 210 and 210A undergo a volume expansion. For example, in addition to being in hydrogen, the anneal may take place at temperature(s) above one hundred degrees Celsius and not more than six hundred degrees Celsius. In some embodiments, the anneal temperature(s) are at least two hundred degrees Celsius and not more than five hundred degrees Celsius. The anneal may take place for an anneal time of at least ten seconds and not more than five hundred seconds. In some embodiments, the anneal time is at least twenty seconds and not more than four hundred seconds. As a result, the exposed portion of the fins 210 and 210A bulge.

Figure 2B:
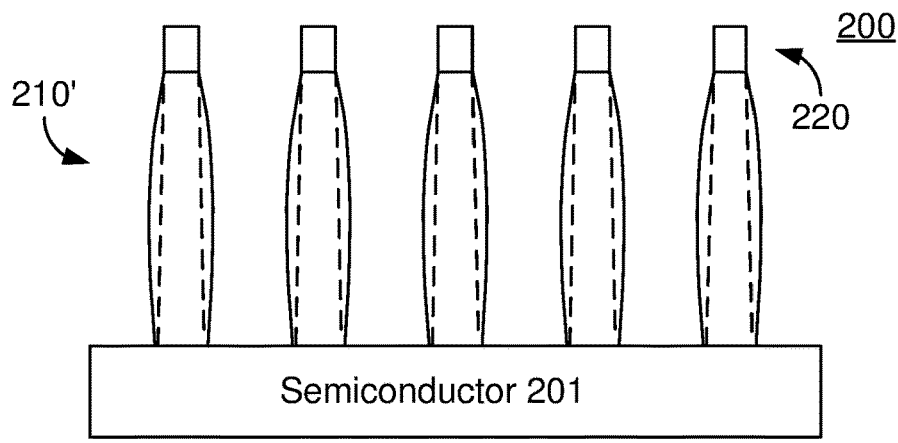
Figure 3B:
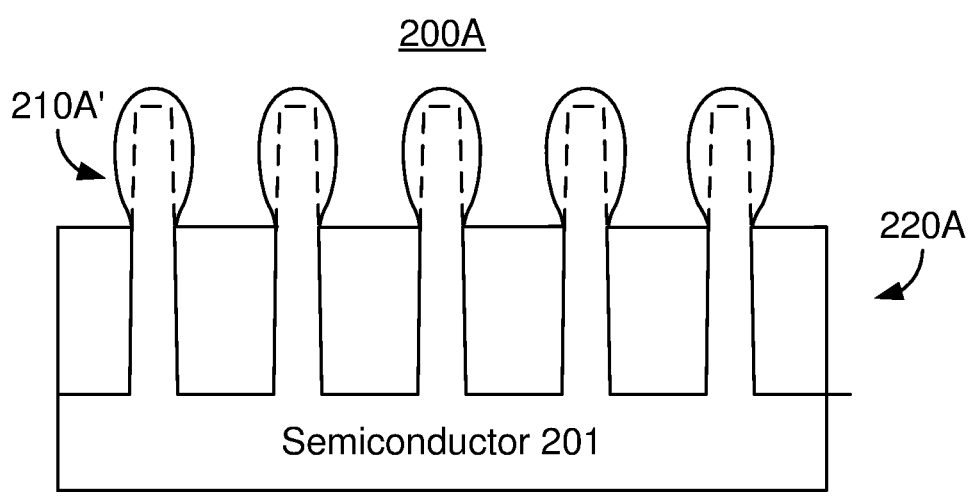

FIGS. 2B and 3B depict the semiconductor devices 200 and 200A, respectively, after step 104 is performed. Referring to FIG. 2B, the sides of the fins 210' were exposed to the anneal. The original locations of the sidewalls are indicated in dashed lines. Thus, the sidewalls of the fins 210' have bulged outward. Consequently, the fins 210' have a convex cross-section in the channel region. Because of the increase in volume of the fins 210', the channels have increased in width. FIG. 3B the tops of the fins 210A' were exposed to the anneal. The original locations of the tops of the fins 210A' are also shown by dashed lines. Thus, the tops of the fins 210A' have undergone a volume expansion. Consequently, the fins 210A' have a larger volume for the top source/drains. Although hydrogen anneals are known, such anneals have been utilized only to mitigate the surface roughness of a Si device. In contrast to the anneal performed in step 104, such anneals may not increase the volume of the structure, such as a fin 210/210A, undergoing the anneal. Stated differently, the anneal performed in step 104 is carried out such that the desired portions of the fins 210/210A are expanded in size.

Using the method 100, the geometry of the fins 210 and 210A may be tailored. By selectively exposing portions of the fins 210 and 210A to a hydrogen anneal, the volume of these portions of the fins 210 and 210A may be selectively increased. In the embodiments shown, the channel of the fins 210' may be increased in width. Similarly, the tops of the fins 210A' may be increased in size. Consequently, the fins 210A' have a larger volume for the top source/drains. In other embodiments, other and/or additional regions of the fins may be exposed to the anneal. These other and/or additional regions may thus be increased in volume. Thus, the geometry of the fins 210/210A may be tailored without significantly altering fabrication or photolithography of the semiconductor devices 200/200A.

Figure 4:
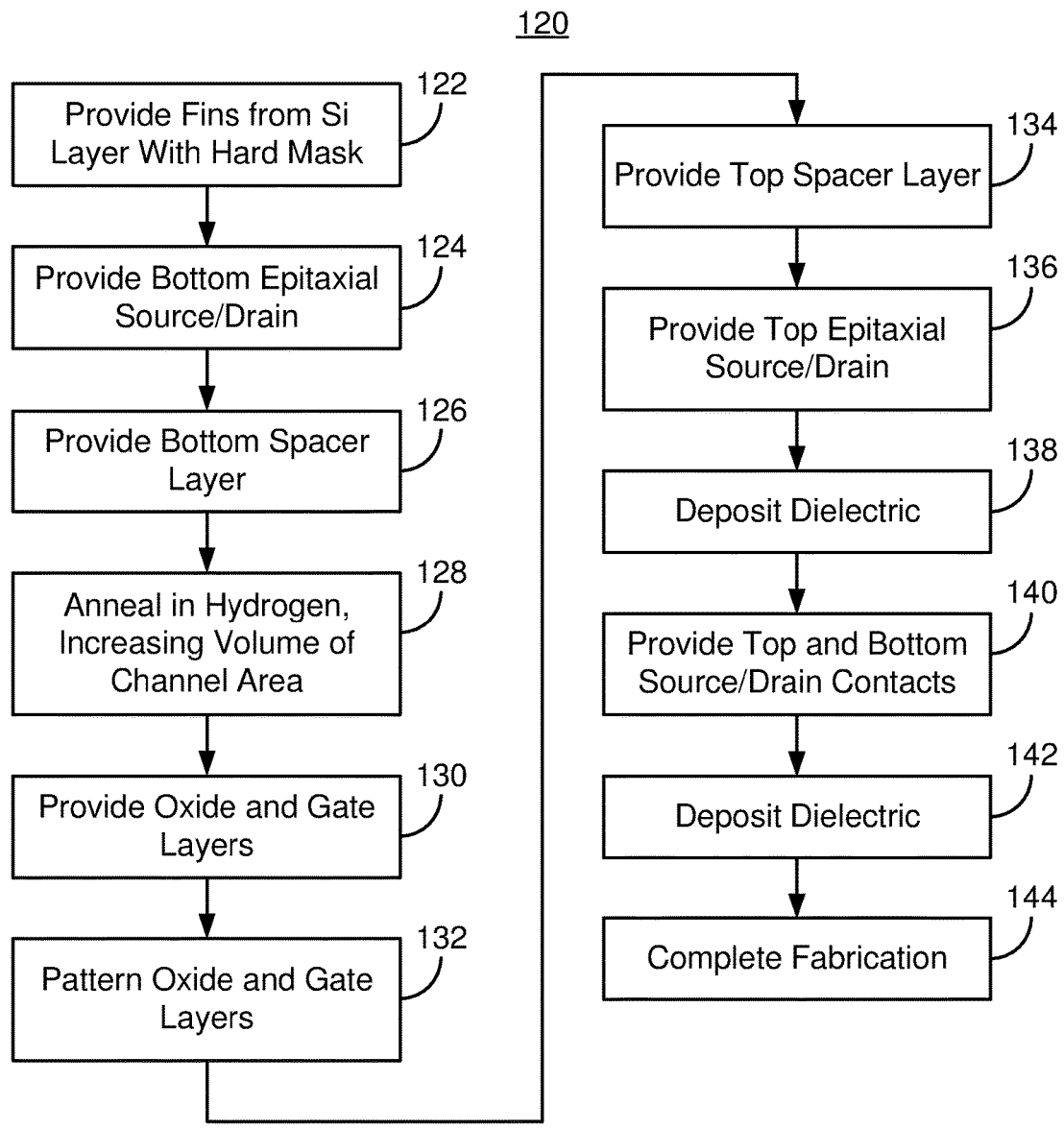
FIG. 4 is a flow chart depicting an exemplary embodiment of a method for providing finFETs having expanded channel volumes in a semiconductor device.

FIG. 4 is a flow chart depicting an exemplary embodiment of a method 120 for providing finFETs having expanded channel volumes in a semiconductor device. For simplicity, some steps may include substeps, may be omitted, may be performed in another order and/or may be combined. Further, the method 120 may start after other steps in forming the semiconductor device have been performed. FIGS. 5A-7 depict portions of an exemplary embodiment of a semiconductor device 250 during fabrication of finFETs using the method 120. For simplicity, not all components are shown in FIGS. 5A-7 and FIGS. 5A-7 are not to scale. For example, various structures that may have been formed prior to the fins are not shown. Further, the thickness of the layers may be exaggerated for explanatory purposes. For clarity, only the structures in the region of the transistors being formed are shown. The method 120 is described in the context of the semiconductor device 250. However, nothing prevents the method 120 from being used with a different semiconductor device.

The fins are provided from a silicon layer, via step 122. For example, a dielectric hard mask may be fabricated on an underlying Si layer. Apertures in the hard mask correspond to regions of the Si to be removed. The Si layer is then etched, leaving the fins. The bottom source/drain regions are formed via step 124. In some embodiments, step 124 include growing an epitaxial layer, such as SiGe, for the source/drain. A bottom spacer layer is also provided, via step 126. Step 126 includes forming a dielectric layer having the desired height on the fin.

FIGS. 5A and 5B depict cross-sectional and perspective views of the semiconductor device 250 after step 126 has been performed. The fins 260 have been formed from the underlying Si layer 251. The hard mask 252 is used in defining the fins 260 from the Si layer 251. Source/drain regions 262 and bottom spacer 264 have also been fabricated.

The semiconductor device 250 is annealed in hydrogen such that the volume of the channel region increases, via step 128. In some embodiments, step 128 includes annealing the semiconductor device 250 at anneal temperature(s) of at least two hundred degrees Celsius and not more than five hundred degrees Celsius for at least twenty seconds and not more than four hundred seconds. In some embodiments, the anneal may be at anneal temperature(s) of at least two hundred fifty degrees Celsius. The anneal time may be at least thirty seconds and not more than three hundred seconds in some embodiments. In the embodiment shown, step 128 is performed after steps 124 and 126. In other embodiments, step 128 may be performed before step 126 or before steps 124 and 126.

FIGS. 6A and 6B depict cross sectional and perspective views of the semiconductor device 250 after step 128 is performed. In FIG. 6A, the original location of the sidewalls above the bottom spacer 264 is indicated by dashed lines. The portions of the fins 260' covered by the mask 252, the source/drain regions 262 and the bottom spacer 264 have not markedly changed in volume. Because of the hydrogen anneal, the exposed portion of the silicon fins 260' have expanded in volume, bowing outward. This results in an increased volume in the channel region of the fins 260'. In addition, as can be seen in FIG. 6B, the outer regions of the fin 260' tend to expand in volume more than the center region.

Fabrication of the finFETs then continues. The oxide and conductive gate layers are provided, via step 130. For example, an interfacial oxide layer and a gate oxide layer may be provided in step 130. In addition, a metal gate may be deposited. The oxide and gate layers are patterned to the desired shape, via step 132. The top spacer layer for the fins 260' is provided, via step 134. The top source and/or drain regions are also provided, via step 136. In some embodiments, step 136 includes forming epitaxial source/drain layers. An insulator may be deposited on the semiconductor device 250, via step 138. Contacts to the top source/drain and bottoms source/drain are formed, via step 140. An additional dielectric may be deposited, via step 142. Fabrication of the semiconductor device 250 may be completed, via step 144.

FIG. 7 depicts a portion of the semiconductor device 250 after fabrication is completed. Thus, three finFETs 280 are shown. Each finFET 280 includes the fin 260' having an expanded channel region, source/drain 262, bottom spacer 264, interfacial oxide 266, gate oxide 270, metal gates 272, top spacer 274 and top source/drain 276.

The method 120 and semiconductor device 250 may share the benefits of the method 100 and semiconductor device 200. Using the method 120, the volume of a portion of the fins 260' has been selectively increased. More specifically, the channel region of the fins 260' in the finFETs 280 has been expanded. Thus, the geometry of the finFETs 280 may be tailored without significantly changing the spacing between the fins 260' or the method 120 of fabricating the finsFETs 280.

Figure 8:
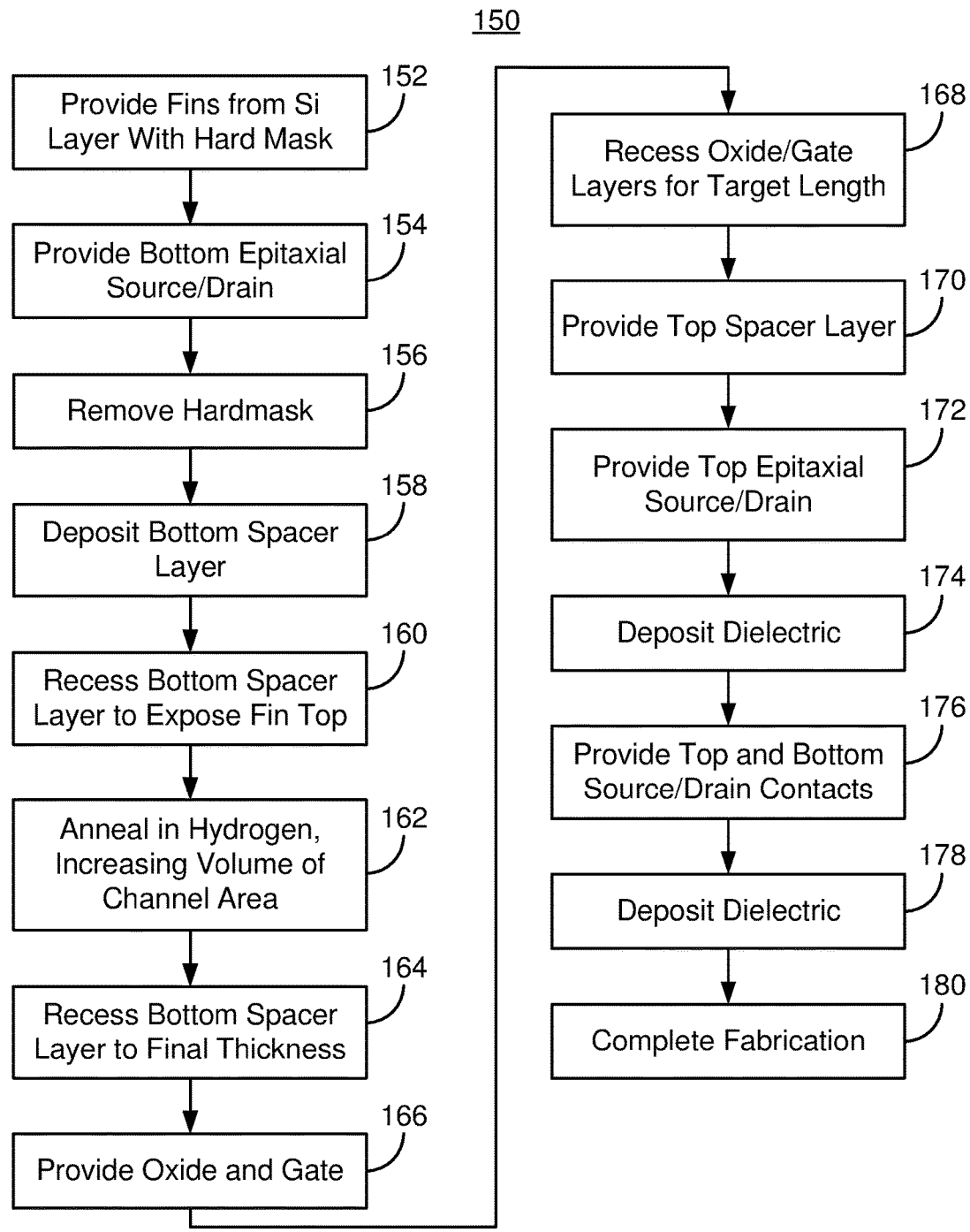
FIG. 8 is a flow chart depicting an exemplary embodiment of a method for providing finFETs having expanded top source/drain volumes in a semiconductor device.

FIG. 8 is a flow chart depicting an exemplary embodiment of a method 150 for providing finFETs having expanded channel volumes in a semiconductor device. For simplicity, some steps may be omitted, may include substeps, may be performed in another order and/or may be combined. Further, the method 150 may start after other steps in forming the semiconductor device have been performed. FIGS. 9-13 depict portions of an exemplary embodiment of a semiconductor device 250A during fabrication of finFETs using the method 150. For simplicity, not all components are shown in FIGS. 9-13 and FIGS. 9-13 are not to scale. For example, various structures that may have been formed prior to the fins are not shown. Further, the thickness of the layers may be exaggerated for explanatory purposes. For clarity, only the structures in the region of the transistors being formed are shown. The method 150 is described in the context of the semiconductor device 250A. However, nothing prevents the method 150 from being used with a different semiconductor device.

The fins are provided from a silicon layer, via step 152. For example, a dielectric hard mask may be fabricated on an underlying Si layer. Apertures in the hard mask correspond to regions of the Si to be removed. The Si layer is then etched, leaving the fins. The bottom source/drain regions are formed via step 154. In some embodiments, step 154 includes growing an epitaxial layer, such as SiGe, for the source/drain regions. Steps 152 and 154 are analogous to steps 122 and 124 of the method 120.

Figure 9:
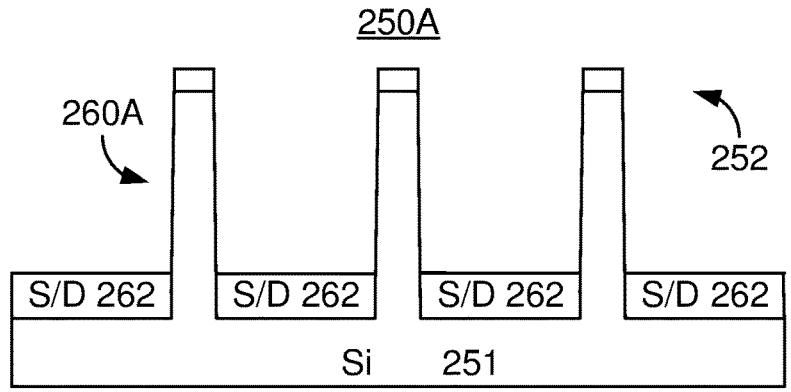
FIGS. 9-12 depict portions of an exemplary embodiment of a semiconductor device including finFETs during fabrication.

FIG. 9 depicts the semiconductor device 250A after step 154 has been performed. Thus, fins 260A have been formed from underlying silicon layer 251. The hard mask 252 is used in defining the fins 260A from the Si layer 251. Source/drain regions 262 and bottom spacer 264 have also been fabricated.

The hard mask 252 used in forming the fins 260A is removed, via step 156. This step is carried out so that the top surface of the fins 260A may be exposed during the anneal, discussed below. A bottom spacer layer is deposited, via step 158.

Figure 10:
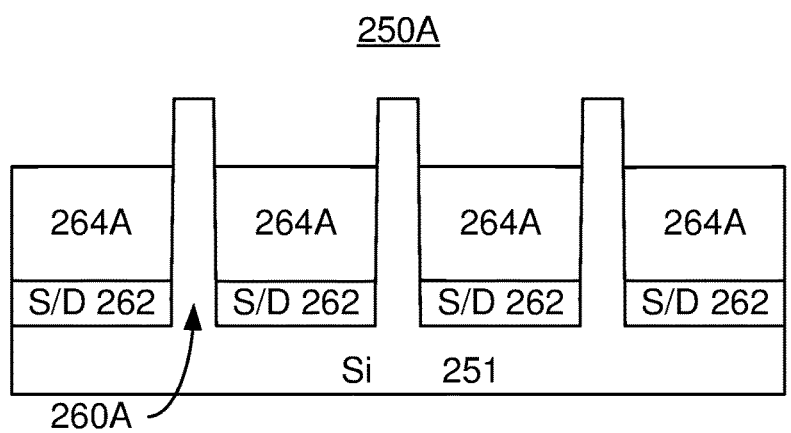

The bottom spacer layer 264A is then recessed to expose the tops of the fins 260A, via step 160. FIG. 10 depicts the semiconductor device 250A after step 160 is performed. Thus, the dielectric layer 264A has been deposited and its height has been reduced to allow the desired amount of the fins 260A to protrude above the top surface of the dielectric layer 264A.

The semiconductor device 250A is annealed in hydrogen such that the volume of the tops of the fins 260A increase, via step 162. In some embodiments, step 162 includes annealing the semiconductor device 250A at anneal temperature(s) of at least two hundred degrees Celsius and not more than five hundred degrees Celsius for at least twenty seconds and not more than four hundred seconds. In some embodiments, the anneal may be at anneal temperature(s) of at least two hundred fifty degrees Celsius. The anneal time may be at least thirty seconds and not more than three hundred seconds in some embodiments.

Figure 11:
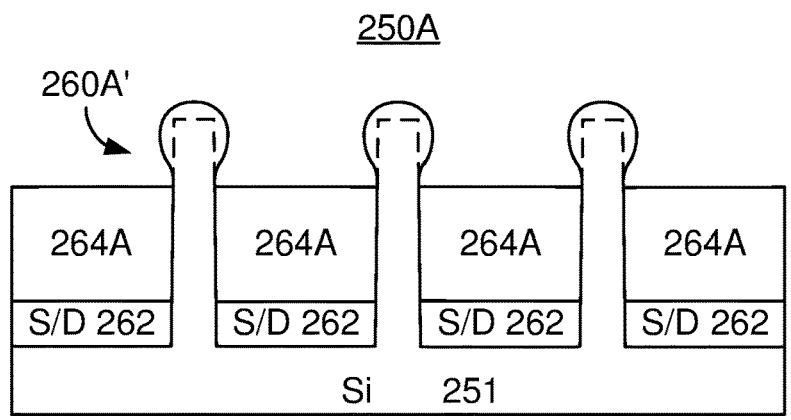

FIG. 11 depicts a cross sectional view of the semiconductor device 250A after step 162 is performed. The original location of the sidewalls and top of the fins 260A' above the spacer 264A is indicated by dashed lines. The portions of the fins 260A' covered by the source/drain regions 262 and the bottom spacer 264A have not markedly changed in volume. Because of the hydrogen anneal, the exposed portion of the silicon fins 260A' have expanded in volume, bowing outward. This convex shape results in an increased volume in the top region of the fins 260A'.

Fabrication of the finFETs then continues. The bottom spacer 264A is thicker than desired in the final device. Thus, the bottom spacer 264A is further recessed, via step 164. The oxide layers and conductive gate are provided, via step 166. For example, an interfacial oxide layer and a gate oxide layer may be provided in step 166. In addition, a metal gate may be deposited. The oxide and gate layers are patterned to the desired shape in a similar manner as for the semiconductor device 250. However, the oxide layers and gate layers are also desired to be removed from the top of the fins 260A' in order to reach the target length. Thus, these layers are recessed, via step 168. The top spacer layer for the fins 260A' is provided, via step 170. The top source and/or drain regions are also provided, via step 172. In some embodiments, step 172 includes forming epitaxial source/drain layers. An insulator may be deposited on the semiconductor device 250A, via step 174. Contacts to the top source/drain and bottoms source/drain are formed, via step 176. An additional dielectric may be deposited, via step 178. Fabrication of the semiconductor device 250A may be completed, via step 180.

Figure 12:
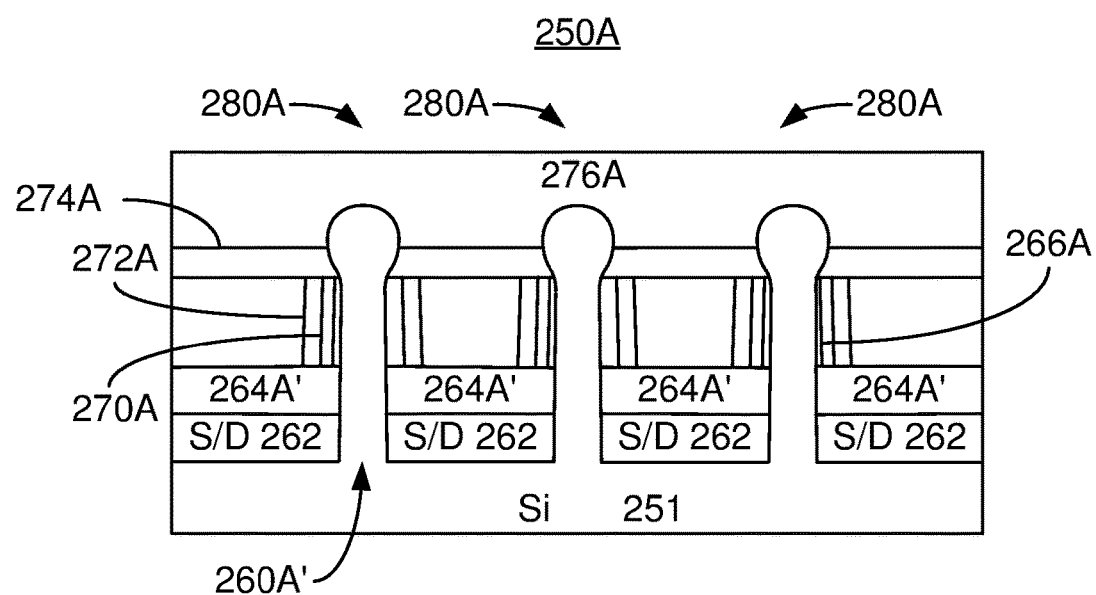

FIG. 12 depicts a portion of the semiconductor device 250A after fabrication is completed. Thus, three finFETs 280A are shown. Each finFET 280A includes the fin 260A' having an expanded source/drain region, source/drain 262, bottom spacer 264A', interfacial oxide 266A, gate oxide 270A, metal gates 272A, top spacer 274A and top source/drain 276A. The bottom spacer layer 264A' has been reduced in thickness in step 164. In addition, the oxides 266A and 270A as well as the metal gates 272A expose the tops of the fins 260A.

The method 150 and semiconductor device 250A may share the benefits of the method 100 and semiconductor device 200. Using the method 150, the volume of a portion of the fins 260A' has been selectively increased. More specifically, the top source/drain regions of the fins 260A' in the finFETs 280A have been expanded. This provide a larger volume for the top source drain process of step 172. Consequently, parasitic resistance may be reduced. Thus, performance of the finFETs 180A may be improved.

A method and system for selectively expanding the volume of fins in semiconductor devices have been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A method for providing a semiconductor device comprising:

providing a plurality of fins such that a first portion of each of the plurality of fins is covered by a mask and a second portion of each of the plurality of fins is exposed by the mask, the plurality of fins being Si fins; and performing an anneal in a volume-increasing ambient at at least one anneal temperature above one hundred degrees Celsius and not more than six hundred degrees Celsius, the second portion of each of the plurality of fins being exposed during the anneal such that the second portion of each of the plurality of fins undergoes a volume expansion;

wherein the second portion of each of the plurality of fins includes at least one of a source area and a drain area such that the at least one of the source and the drain undergoes an expansion during the anneal.

2. The method of claim 1 wherein the volume increasing ambient is hydrogen gas.

3. The method of claim 2 wherein the step of performing the anneal further includes performing the anneal for an anneal time of at least ten seconds and not more than five hundred seconds.

4. The method of claim 3 wherein the anneal time is at least twenty seconds and not more than four hundred seconds.

5. The method of claim 2 wherein the at least one anneal temperature is at least two hundred degrees Celsius and not more than five hundred degrees Celsius.

6. The method of claim 2 wherein the step of providing the plurality of fins further includes:

providing a hard mask on a semiconductor layer, the hard mask exposing a portion of the semiconductor layer;

removing an exposed portion of the semiconductor layer to form the plurality of fins, each of the plurality of fins having a top surface, the hard mask residing on the top surface;

providing a bottom source/drain epitaxial layer; and providing a bottom spacer, the bottom spacer and the hard mask forming the mask.

7. A method for providing a semiconductor device comprising:

providing a plurality of fins such that a first portion of each of the plurality of fins is covered by a mask and a second portion of each of the plurality of fins is exposed by the mask, the plurality of fins being Si fins; and performing an anneal in a volume-increasing ambient at at least one anneal temperature above one hundred degrees Celsius and not more than six hundred degrees Celsius, the second portion of each of the plurality of fins being exposed during the anneal such that the second portion of each of the plurality of fins undergoes a volume expansion;

wherein the second portion of each of the plurality of fins includes a channel region such that the channel region undergoes an expansion during the anneal.

8. A method for providing a semiconductor device comprising:

providing a plurality of fins such that a first portion of each of the plurality of fins is covered by a mask and a second portion of each of the plurality of fins is exposed by the mask, wherein the step of providing the plurality of fins further includes:

providing a hard mask layer on a semiconductor layer, the hard mask layer exposing a portion of the semiconductor layer;

removing an exposed portion of the semiconductor layer to form the plurality of fins, each of the plurality of fins having a top surface, the hard mask layer residing on the top surface;

removing the hard mask;

providing a bottom source/drain epitaxial layer; and providing a recessed bottom spacer, the recessed bottom spacer forming the mask; and performing an anneal in a volume-increasing ambient at at least one anneal temperature above one hundred degrees Celsius and not more than six hundred degrees Celsius, the second portion of each of the plurality of fins being exposed during the anneal such that the second portion of each of the plurality of fins undergoes a volume expansion.

9. A method for providing a semiconductor device comprising:

providing a plurality of fins such that a first portion of each of the plurality of fins is covered by a mask and a second portion of each of the plurality of fins is exposed by the mask, each of the plurality of fins consisting of Si; and performing an anneal in a hydrogen ambient at at least one anneal temperature for an anneal time in the presence of the mask, the at least one anneal temperature being at least two hundred degrees Celsius and not more than five hundred degrees Celsius, the anneal time being at least twenty seconds and not more than four hundred seconds, the second portion of each of the plurality of fins being exposed during the anneal such that the second portion of each of the plurality of fins undergoes a volume expansion, the second portion including at least one of a channel region and a top source/drain region.

10. The method of claim 9 wherein the step of providing the plurality of fins further includes:

providing a hard mask layer on a semiconductor layer, the hard mask layer exposing a portion of the semiconductor layer;

removing an exposed portion of the semiconductor layer to form the plurality of fins, each of the plurality of fins having a top surface, the hard mask layer residing on the top surface;

removing the hard mask;

providing a bottom source/drain epitaxial layer; and providing a recessed bottom spacer, the recessed bottom spacer forming the mask.

* * * * *